United States Patent
Tsironis (10) Patent No.: US 10,756,694 B1
(45) Date of Patent: Aug. 25, 2020

(54) MHZ RANGE HARMONIC IMPEDANCE TUNER AND METHOD

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 28 days.

(21) Appl. No.: 16/039,383

(22) Filed: Jul. 19, 2018

Related U.S. Application Data (60) Provisional application No. 62/535,292, filed on Jul. 21, 2017.

(51) Int. Cl.
| | |
|---|---|
| *H03H 7/12* | (2006.01) |
| *H03H 7/01* | (2006.01) |
| *G01R 31/28* | (2006.01) |
| *H03H 7/38* | (2006.01) |

(52) U.S. Cl.
CPC ......... *H03H 7/12* (2013.01); *G01R 31/2822* (2013.01); *H03H 7/1708* (2013.01); *H03H 7/38* (2013.01); *H03H 2210/025* (2013.01); *H03H 2210/04* (2013.01)

(58) Field of Classification Search
CPC .......... H03H 7/12; H03H 7/1708; H03H 7/38; H03H 2210/04; H03H 2210/025; G01R 31/2822
USPC .............................................. 324/615; 333/32
See application file for complete search history.

(56) References Cited

U.S. PATENT DOCUMENTS

| | | | |
|---|---|---|---|
| 5,034,708 A | 7/1991 | Adamian et al. | |
| 6,297,649 B1 | 10/2001 | Tsironis | |
| 7,646,267 B1 | 1/2010 | Tsironis | |
| 7,646,268 B1 | 1/2010 | Tsironis | |
| 8,497,745 B1* | 7/2013 | Tsironis | H03H 7/38 333/17.3 |
| 2013/0201882 A1* | 8/2013 | Bauder | H03H 7/48 370/277 |

OTHER PUBLICATIONS

"A Load Pull System with Harmonic Tuning", ATN Microwave Inc., Microwave Journal, Mar. 1996.
"High Resolution Tuners Eliminate Load Pull Performance Errors", Application Note 15, Focus Microwaves, Jan. 1995, p. 6.
(Continued)

*Primary Examiner* — Farhana A Hoque (57) ABSTRACT

An electro-mechanical MHz range harmonic load pull tuner is made as a cascade of filter sections and independent tuning sections; the filter section includes three parallel series resonant circuits, each set including one inductor and one adjustable capacitor. The tuning section includes three parallel tuning modules; each module comprising three adjustable shunt air capacitors inter-connected using coaxial cables of appropriate length. Each capacitor is remotely adjustable to 10 or 20 values (settings); the tuner creates independently controllable impedances at three (harmonic) frequencies in octave size frequency bands between 5 and 150 MHz. An Error Function-based optimization algorithm allows impedance tuning at three frequencies independently, by optimized searching among the more than $20^9=512*10^9$ possible combined tuner states. Stepper motors, drivers and control software are used to automate, calibrate and use the harmonic tuner for automated harmonic load pull measurement.

9 Claims, 12 Drawing Sheets

(56) References Cited

OTHER PUBLICATIONS

"MPT, a Universal Multi-Purpose Tuner", Product Note 79, Focus Microwaves Inc., Oct. 2004.
"Numerical Optimization Techniques for Engineering Design", Search Algorithm Literature, Garret N. Vanderplaats, McGraw Hill 1984, ISBN-10-0070669643.
Diplexer [online], Wikipedia, [Retrieved on Jul. 17, 2018]. Retrieved from Internet <URL: https://en.wikipedia.org/wiki/Diplexer>.
Coaxial Triplexer, ZTPL-4620+ Datasheet [online], Mini Circuits [Retrieved on Jul. 17, 2018]. Retrieved from Internet <URL: https://www.minicircuits.com/WebStore/dashboard.html?model=ZTPL-4620%2B>.

* cited by examiner

L1, L2, L3 = Fixed transmission lines (coaxial cables)
C1, C2, C3 = Variable Capacitors

MHZ RANGE HARMONIC IMPEDANCE TUNER AND METHOD

PRIORITY CLAIM

This application claims priority on provisional application 62/535,292, titled "MHz range harmonic impedance tuner and method", filed on Jul. 21, 2017.

CROSS-REFERENCE TO RELATED ARTICLES

1. Tsironis, U.S. Pat. No. 7,646,267, "Low frequency electro-mechanical impedance tuner".
2. Adamian et al. U.S. Pat. No. 5,034,708, "Programmable broadband electronic tuner".
3. Tsironis, U.S. Pat. No. 7,646,268, "Low frequency harmonic load pull tuner and method".
4. "A Load Pull System with Harmonic Tuning", ATN Microwave Inc., Microwave Journal, March 1996.
5. "High Resolution Tuners Eliminate Load Pull Performance Errors", Application Note 15, Focus Microwaves, January 1995, page 6.
6. Tsironis, U.S. Pat. No. 6,297,649, "Harmonic rejection load tuner".
7. "MPT, a Universal Multi-Purpose Tuner", Product Note 79, Focus Microwaves, October 2004.
8. "Numerical Optimization Techniques for Engineering Design", Search Algorithm Literature, Garret N. Vanderplaats, McGraw Hill 1984, ISBN-10-0070669643.
9. Diplexer [online], Wikipedia, [Retrieved on 2018 Jul. 17]. Retrieved from Internet <URL: https://en.wikipedia.org/wiki/Diplexer>.
10. Coaxial Triplexer, ZTPL-4620+ Datasheet [online], Mini Circuits [Retrieved on 2018 Jul. 17]. Retrieved from Internet <URL: https://www.minicircuits.com/WebStore/dashboard.html?model=ZTPL-4620%2B>.

BACKGROUND OF THE INVENTION

This invention relates to load pull testing of radio frequency transistors and amplifiers, at frequencies typically between 10 MHz and 150 MHz, under high power operating conditions. The test method uses automatic impedance tuners for synthesizing user defined impedances at the input and output of the devices under test (DUT) at the fundamental and up to two harmonic frequencies.

Load Pull is a measurement technique, in which the source and/or load impedance presented to a DUT (typically a power RF transistor) is changed systematically using pre-calibrated impedance tuners, while measuring the DC and/or RF performance of the DUT. This technique is popular at frequencies in the GHz frequency range but, hitherto, unknown in the frequency range below 100 MHz.

Accurate design of high power amplifiers, oscillators and other active components used in various communication systems requires accurate knowledge of the active device's (RF transistor's) characteristics under high power operation conditions. In such circuits, it is insufficient and inaccurate to describe transistors, operating in compression and at extreme high power in their highly non-linear regions, close to saturation ("saturation" means an increase in input power does not result into any increase in output power, "compression" means that the output power increases less than proportionally to the input power), using analytical or numerical models only. Instead the transistors need to be characterized using specialized test setups under the actual operating conditions.

The popular "load pull" and "source pull" method for testing and characterizing such components (transistors) under high power operation conditions has been developed at much higher frequencies in the GHz frequency range. Load pull or source pull are measurement techniques employing RF impedance tuners and other RF test equipment, such as RF signal sources and RF power meters. Since transistors are typically used close to power saturation conditions in high efficiency amplifiers, their internal non-linearities deform the input signal and this deformation is revealed as a number of harmonic frequency components in the output signal. Those frequency components, if not terminated with the appropriate RF harmonic impedance, will degrade the performance of the amplifier. In order to generate the proper harmonic RF impedance a Harmonic Load Pull system is required. In such a system certain frequency selective components, such as frequency discriminators (Diplexers for 2 frequencies, Fo and 2Fo, or Triplexers for 3 frequencies Fo, 2Fo and 3Fo), see ref. 9 and 10, are used, whose task is to guide the harmonic components generated by the DUT into different paths, where they can be treated separately (FIG. 1); wideband impedance tuners can be used, in this case, since the frequency separation is done before the signal arrives at the tuners. Harmonic impedance tuners (see ref. 6 and 7) are also used in order to manipulate the harmonic microwave impedances under which the Device under Test (DUT, amplifier or transistor) is tested (FIG. 2). Note: Commercial Triplexers in this frequency (see ref. 10) are not frequency adjustable and are fixed designs for specific telecom frequency bands, not for harmonic frequencies. For instance, the Triplexer in ref. 10 has a main channel from 9.8 to 10.2 MHz, and secondary channels at 852-1872 and 3300-4620 MHz respectively, unrelated to harmonic frequencies. For harmonic load pull one requires "harmonic Triplexers", not available at these MHz range frequencies.

Figure 1:
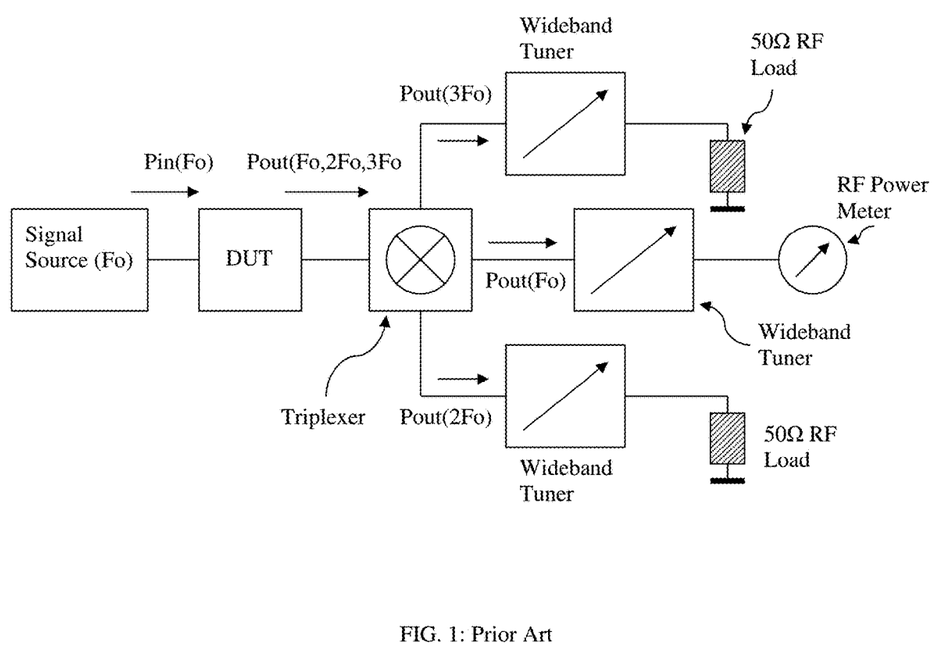
FIG. 1 depicts prior art, a harmonic load pull setup using frequency triplexer (3 frequency discriminator) and three wideband tuners.
Figure 2:
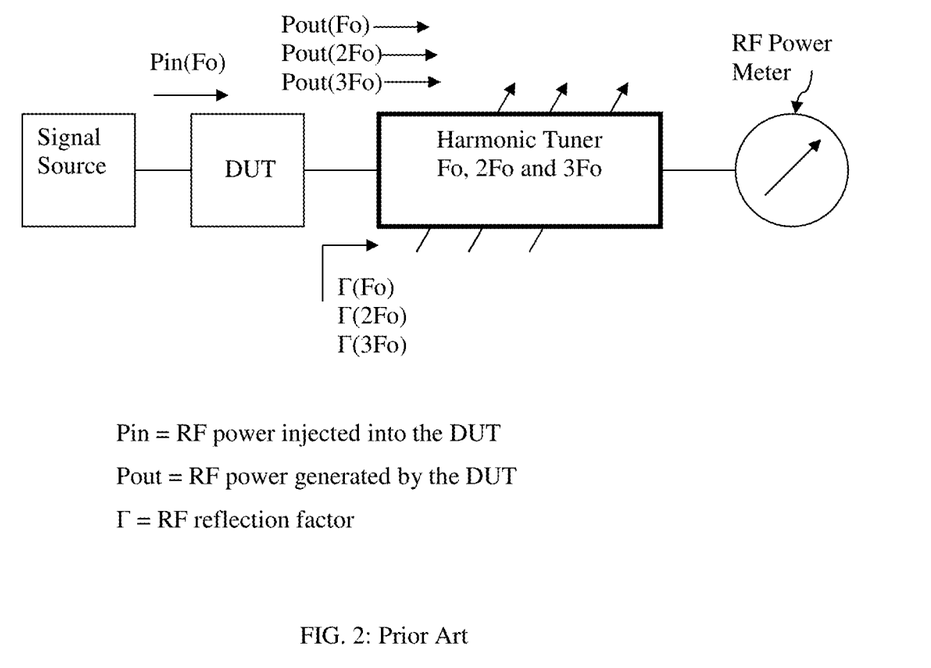
FIG. 2 depicts prior art, a harmonic load pull setup using harmonic tuner.

FIG. 1 shows a setup using a frequency diplexer or triplexer allowing creating three independent frequency paths, loaded each with a wideband tuner. This concept of harmonic tuning is well known in the literature and is valid for all frequencies for which appropriate components, such as tuners and diplexers/triplexers, exist. Because of lack of such components harmonic load pull test systems are not known for frequencies below 800 MHz. This, on the other hand is due to the difficulty in manufacturing such wideband components in coaxial or waveguide because of their required size to handle low frequencies and large wavelengths. The MHz frequency range is for L-C components.

A simpler solution for a GHz-range harmonic load pull test system will use a single multi-harmonic tuner (see ref. 7), i.e. a tuner which allows independent tuning at harmonic frequencies without using frequency discriminators, such as diplexers and triplexers. Such a setup is shown in FIG. 2.

DESCRIPTION OF PRIOR ART

Figure 3A:
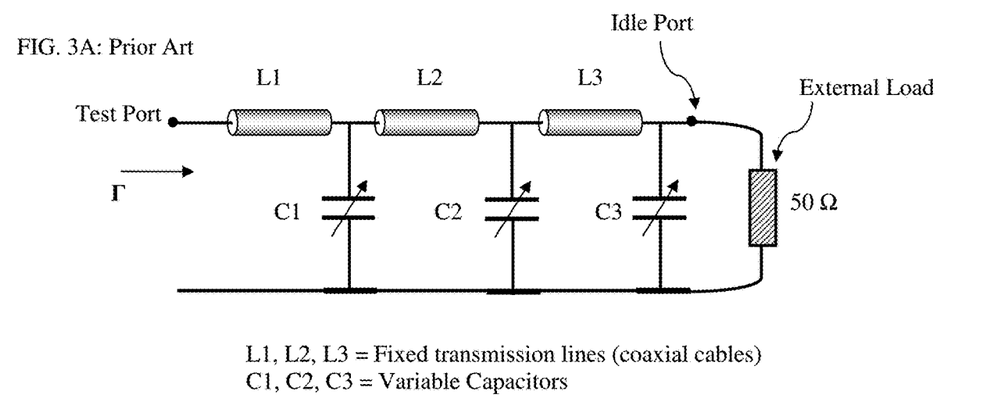
Figure 3B:
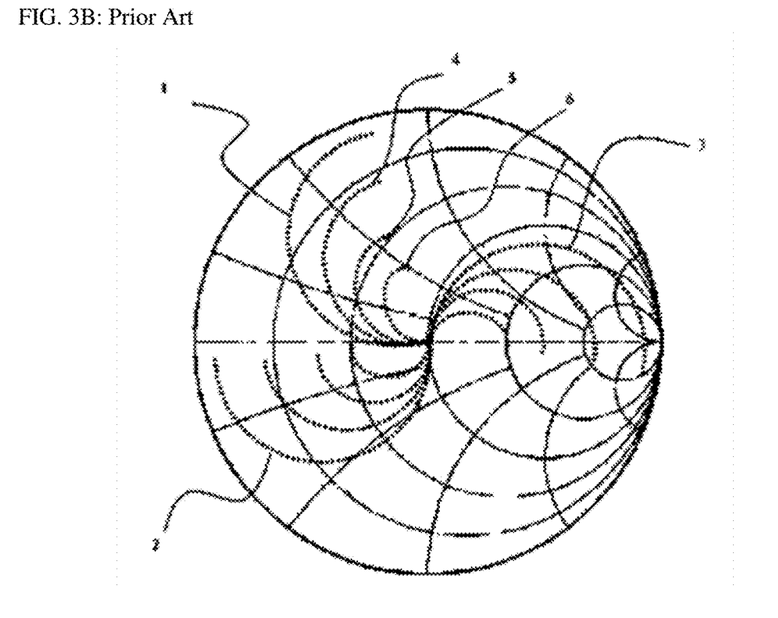

Electro-mechanical low frequency tuners have been disclosed in ref. 1; they are made using variable rotary shunt capacitors (C1, C2, C3 in FIG. 3A and FIG. 4) and fixed lengths of coaxial cable between them (L1, L2, L3 in FIG. 3A). The capacitors are driven by electrical motors, best suited are stepper motors, because they define precisely the angle of the rotating capacitor blades. By using capacitors of various maximum values and operating frequency ranges and varying each of them between its minimum and maximum value the reflection factor Γ (FIG. 3B) describes an arc on the Smith Chart. Various circuits of traces are created when various lengths of cable (L1, L2, and L3 in FIG. 3B) are inserted between the capacitors. The various traces within each set change with frequency. As the frequency changes those shapes change as well, since both the actual impedance value of the capacitors change with frequency as do the electrical lengths of the cables. The result is quasi-total reflection factor coverage for each specific frequency Fo as a function of the settings of the shunt capacitors. The effect is similar at the harmonic frequencies 2Fo and 3Fo as well, depending on values of capacitors Ci and transmission lines Li; it is understood that the different capacitors Ci and lines Li belong to different tuners.

Figure 4A:
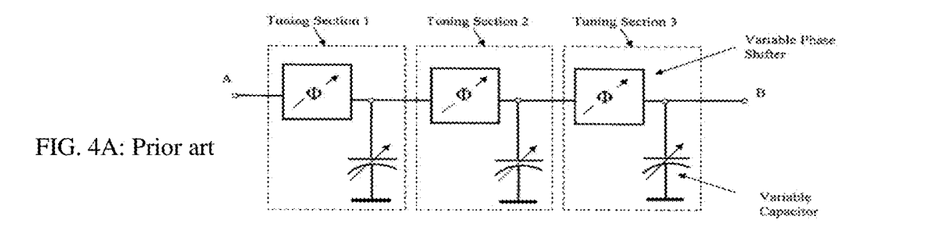
FIG. 4A through 4B depict prior art, two conceptually possible configurations of harmonic MHz range tuners, using a cascade of three tuning modules, each using variable shunt capacitor and variable line stretcher (FIG. 4B) or phase shifter (FIG. 4A) instead of fixed transmission lines.
Figure 4B:
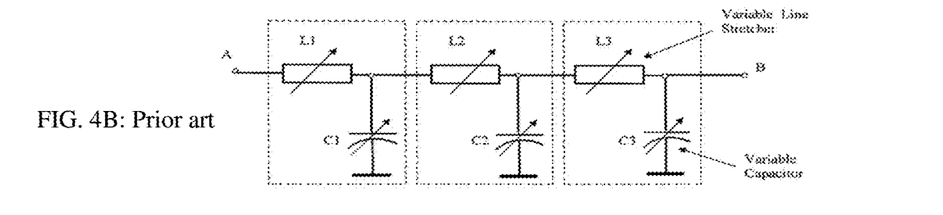

High VHF (150-300 MHz) and low UHF (300-400 MHz) harmonic load pull impedance tuners have been disclosed in ref. 2; they comprise three variable shunt capacitors connected between them with variable phase shifters/line stretchers (FIG. 4) and are able to create and adjust reflection factors at a fundamental frequency (Fo) and one or two harmonic frequencies (2Fo, 3Fo) independently. In this configuration the line stretchers must be at least one half of a wavelength ($\lambda/2$) long at le lowest frequency of operation; for example at F=10 MHz this is 15 meters. It is therefore obvious that the above configuration is not suitable for such low frequencies.

The alternative solution described here is a harmonic load pull tuner, which uses either readily available or reasonably made operational components in the 10 MHz to 250 MHz frequency range, which are combined in such a way as to allow a harmonic tuner to be assembled, calibrated and operated efficiently.

BRIEF DESCRIPTION OF THE SEVERAL VIEWS OF THE DRAWINGS

The invention and its mode of operation will be more clearly understood from the following detailed description when read with the appended drawings in which:

FIG. 3A through 3B depict prior art, MHz range tuner using variable shunt capacitors and fixed transmission lines between them; FIG. 3A depicts LC tuner circuit; FIG. 3B depicts reflection factor trajectories for a number of fixed lengths of transmission lines and adjustable capacitor values.

FIG. 6A is the coverage at Fo, FIG. 6B is the coverage at 2Fo and FIG. 6C is the coverage at 3Fo.

FIG. 7A is the coverage at Fo, FIG. 7B is the coverage at 2Fo and FIG. 7C is the coverage at 3Fo.

FIG. 8A is the coverage at Fo, FIG. 8B is the coverage at 2Fo and FIG. 8C is the coverage at 3Fo.

FIG. 10A through 10C depict combined input reflection factor coverage of the MHz range harmonic tuner of FIG. 5: FIG. 10A depicts coverage at Fo; FIG. 10B depicts coverage at 2Fo and FIG. 10C depicts coverage at 3Fo; in all cases coverage at the remaining two frequencies is also shown.

DETAILED DESCRIPTION OF THE INVENTION

Figure 5:
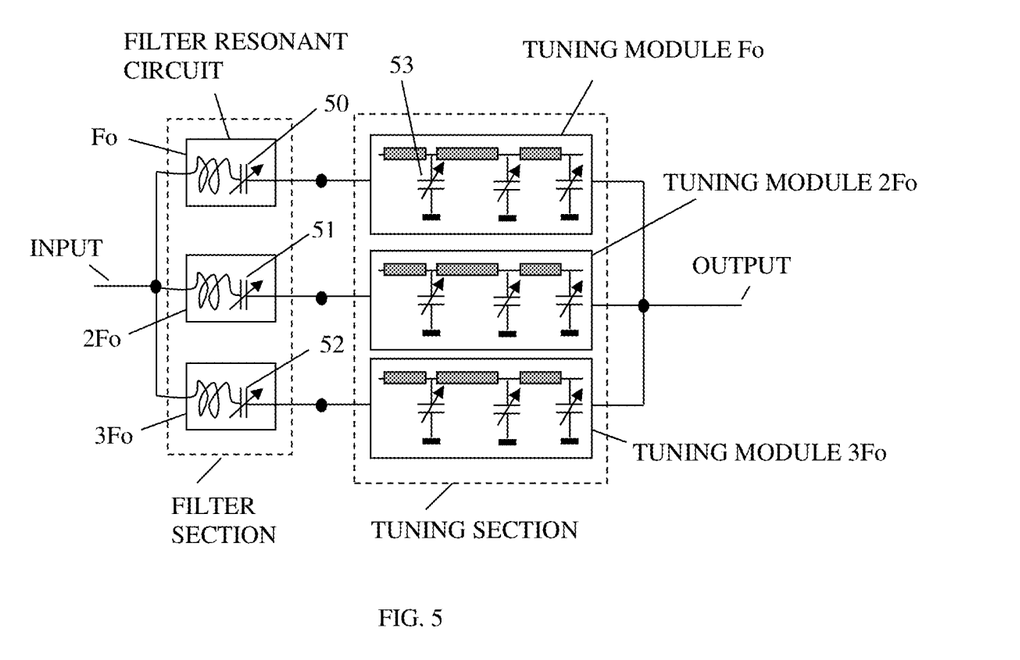
FIG. 5 depicts harmonic MHz range tuner, comprising three adjustable series LC resonant filter circuits (Fo to 3Fo) cascaded with associated MHz range tuning modules, each resonant filter set and tuning module operating at a different harmonic frequency.
Figures 6A, 6B, 6C:
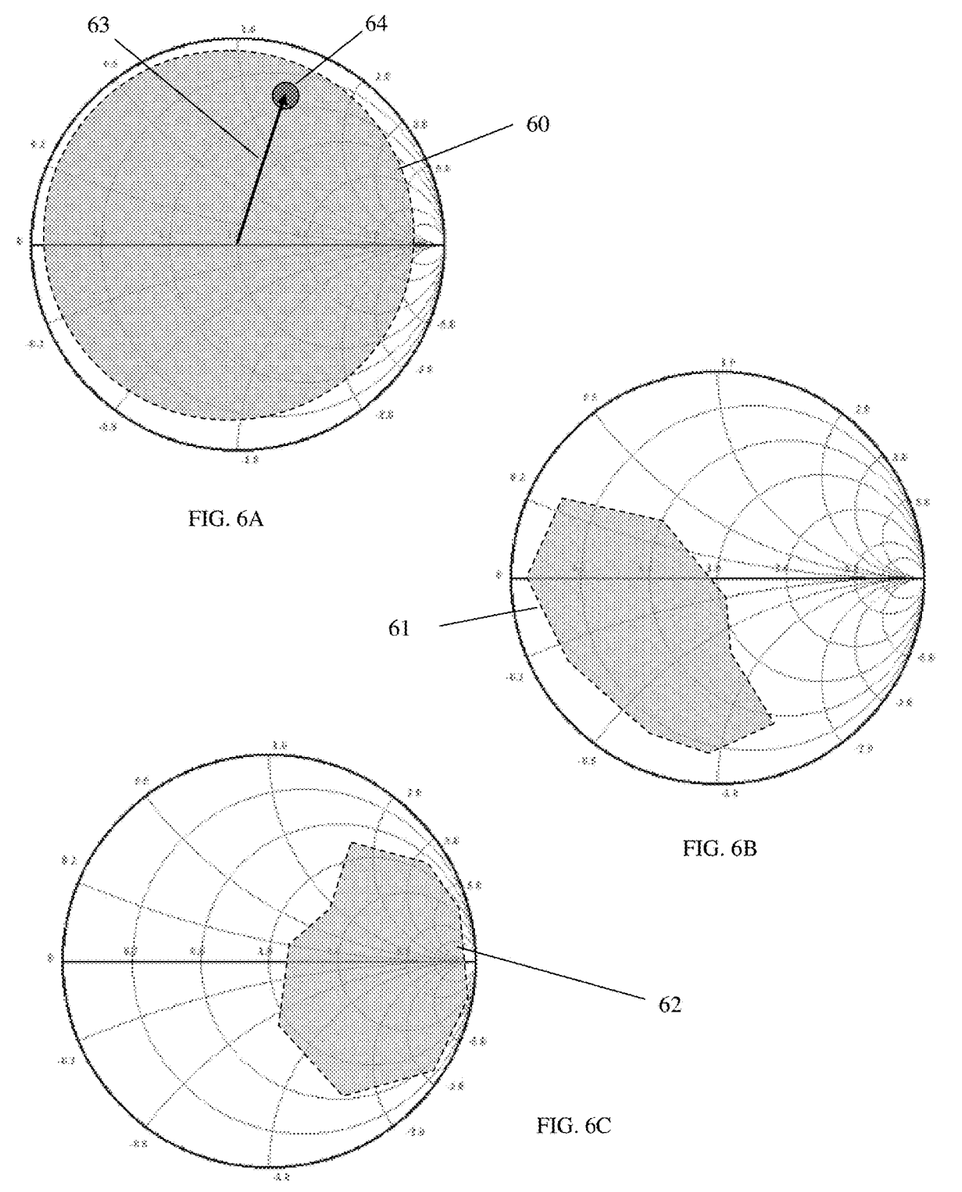
FIG. 6A through 6C depict reflection factor coverage of tuning module Fo in FIG. 5, at the three harmonic frequencies.
Figure 7A:
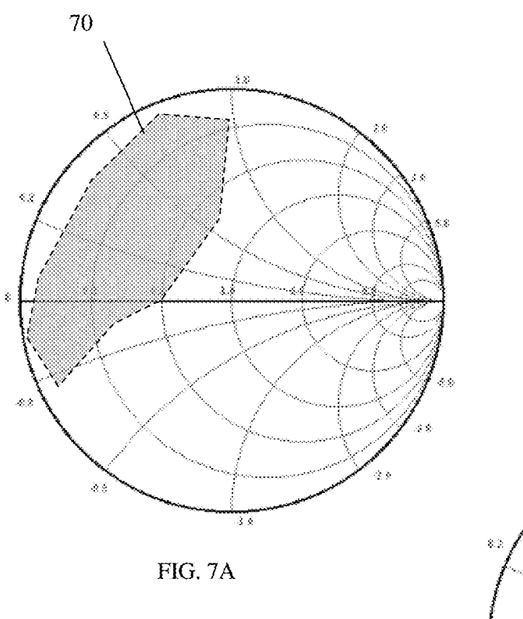
FIG. 7A through 7C depict reflection factor coverage of tuning module 2Fo in FIG. 5, at the three harmonic frequencies.
Figure 7B:
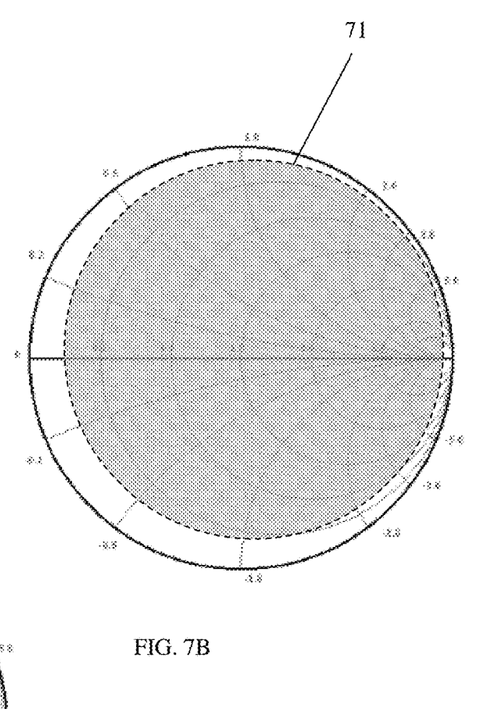
Figure 7C:
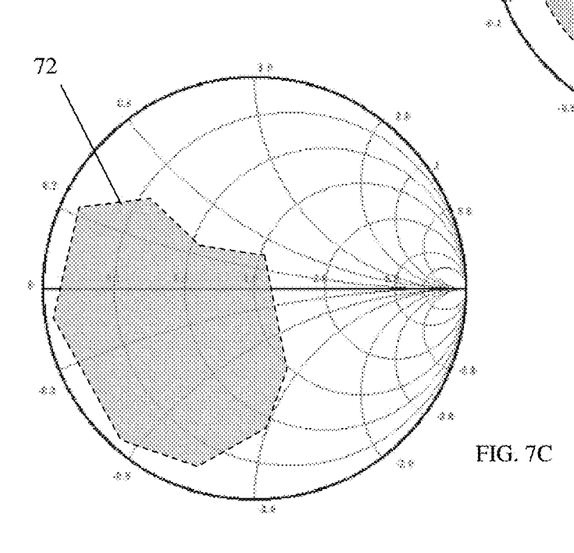
Figure 8A:
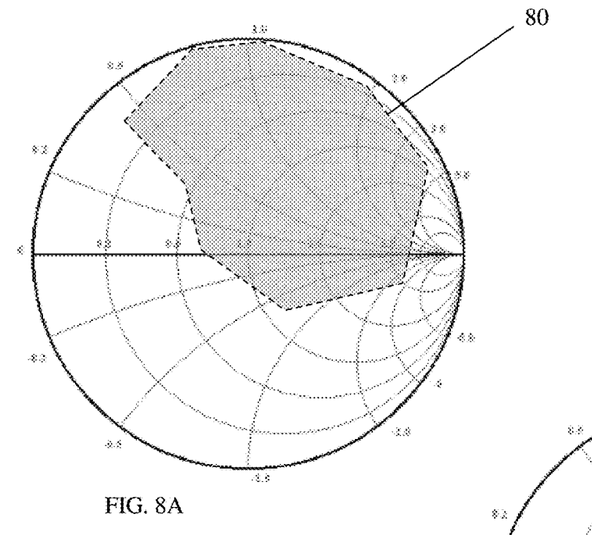
FIG. 8A through 8C depict reflection factor coverage of tuning module 3Fo in FIG. 5, at the three harmonic frequencies.
Figure 8B:
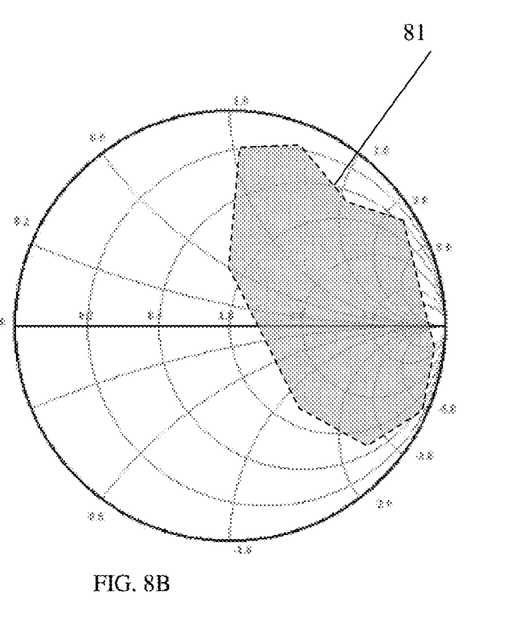
Figure 8C:
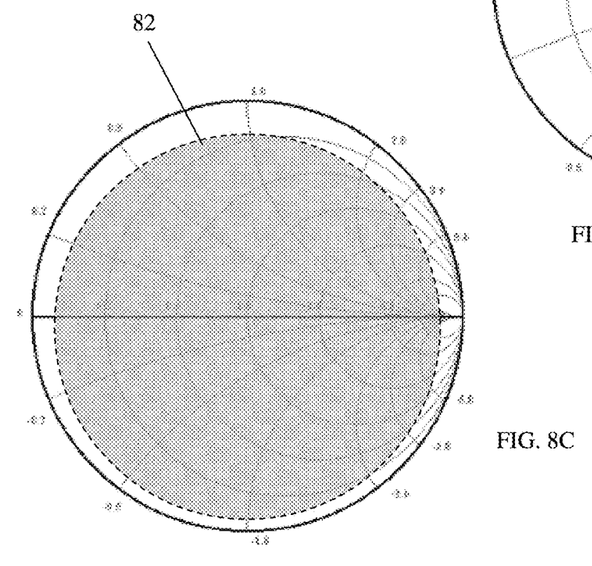

The new configuration for a MHz range harmonic tuner uses the general concept of low frequency three-capacitor tuner modules, (see ref. 1), each module cascaded with an adjustable series resonant LC filter circuit (FIG. 5). The cascades of filter and tuning module are connected in parallel: the input terminal of the parallel network is the input (test) port of the tuner, the output terminal of the parallel network is the output (idle) port of the tuner. The resonance frequency of each filter is Fres=$1/(2*\pi*\text{sqrt}(L*C))$. Fres for each of the modules is set to Fo, 2Fo and 3Fo. Each tuning module covers a frequency range around a pre-defined harmonic frequency (Fo, 2Fo or 3Fo). One module covers a frequency range around the fundamental frequency Fo (FIG. 6), the second module covers a frequency range around 2Fo (FIG. 7) and the third module the frequency range around 3Fo (FIG. 8). However, the tuning modules are in their nature wideband. The Fo module creates full Smith chart coverage 60 in the frequency area around Fo (item 60 in FIG. 6A) but generates reduced coverage 61 in the frequency areas around 2Fo (FIG. 6B) and 3Fo, item 62 (FIG. 6C). Similarly, the 2Fo tuning module, centered around 2Fo (FIG. 7B) creates full coverage at 2Fo, item 71, and reduced reflection 70 at Fo (FIG. 7A) and 3Fo, item 72, (FIG. 7C). The 3Fo tuning module is centered around 3Fo (FIG. 8C) and creates associated full coverage 82, but also creates reduced reflection around Fo, item 80, FIG. 8A) and 2Fo, item 81, (FIG. 8B). As such, simple parallel networking these three tuning modules, would create a basic harmonic tuner. However, as the shadowed areas items 61, 62, 70, 72, 80 and 81 in FIG. 6 through 8 show, the suppression of the non-tuned frequency is not high enough to create enough independent harmonic tuning. Other than in prior art (FIG. 4) the tuning modules in FIG. 5, do not comprise adjustable phase shifters or line stretchers, that would allow better harmonic tuning separation (see ref. 7). Such 360 degree phase shifters and wavelength long line stretchers are borderline feasible at VHF frequencies (>250 MHz), but not possible at 5 or 10 MHz, because for the required physical length of such components (the wavelength at 10 MHz is 30 meters). This invention discloses a realistic alternative solution to this impossibility.

Figure 9:
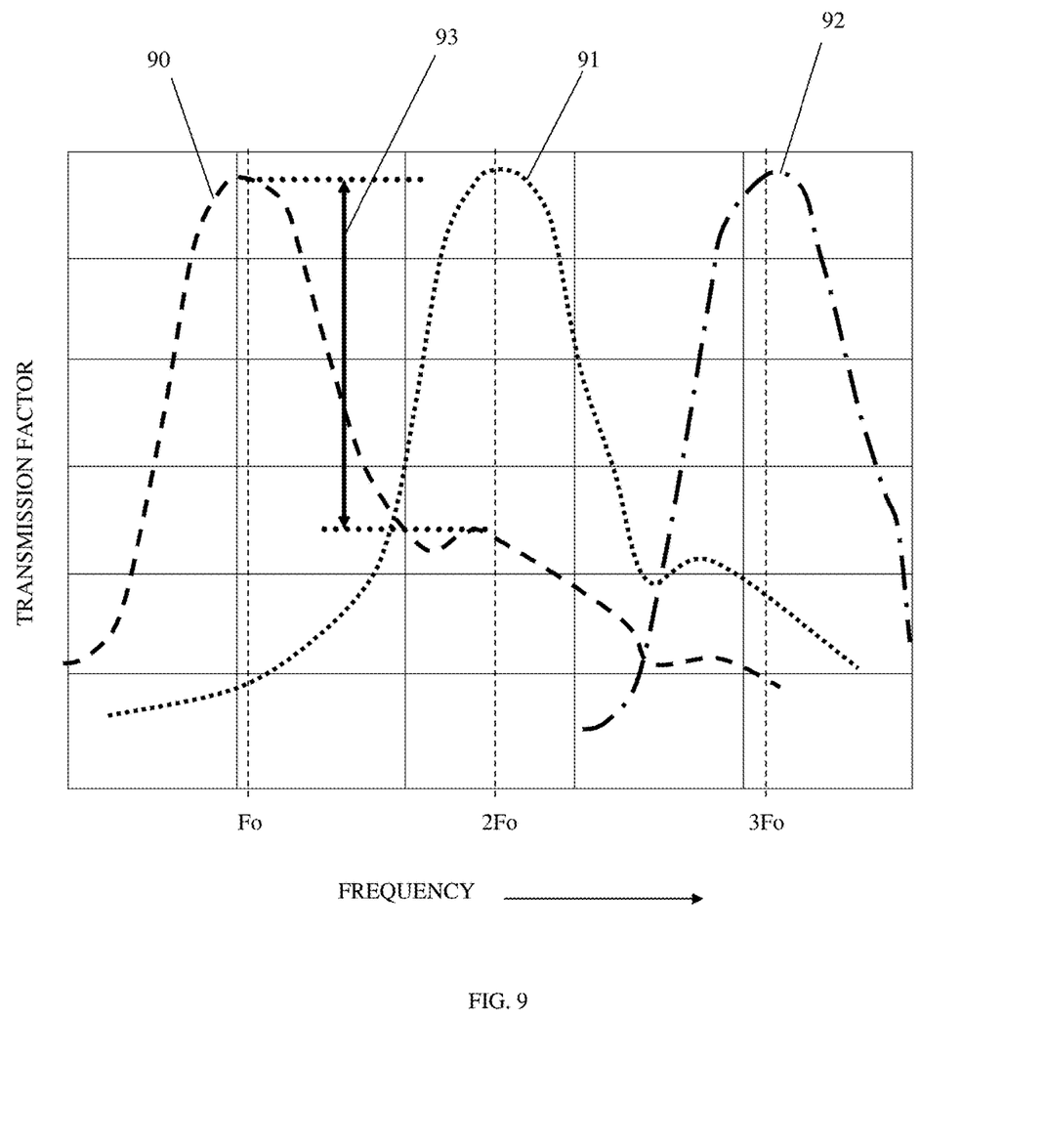
FIG. 9 depicts transmission factor frequency response of the resonant filter circuits in FIG. 5.
Figures 10A, 10B, 10C:
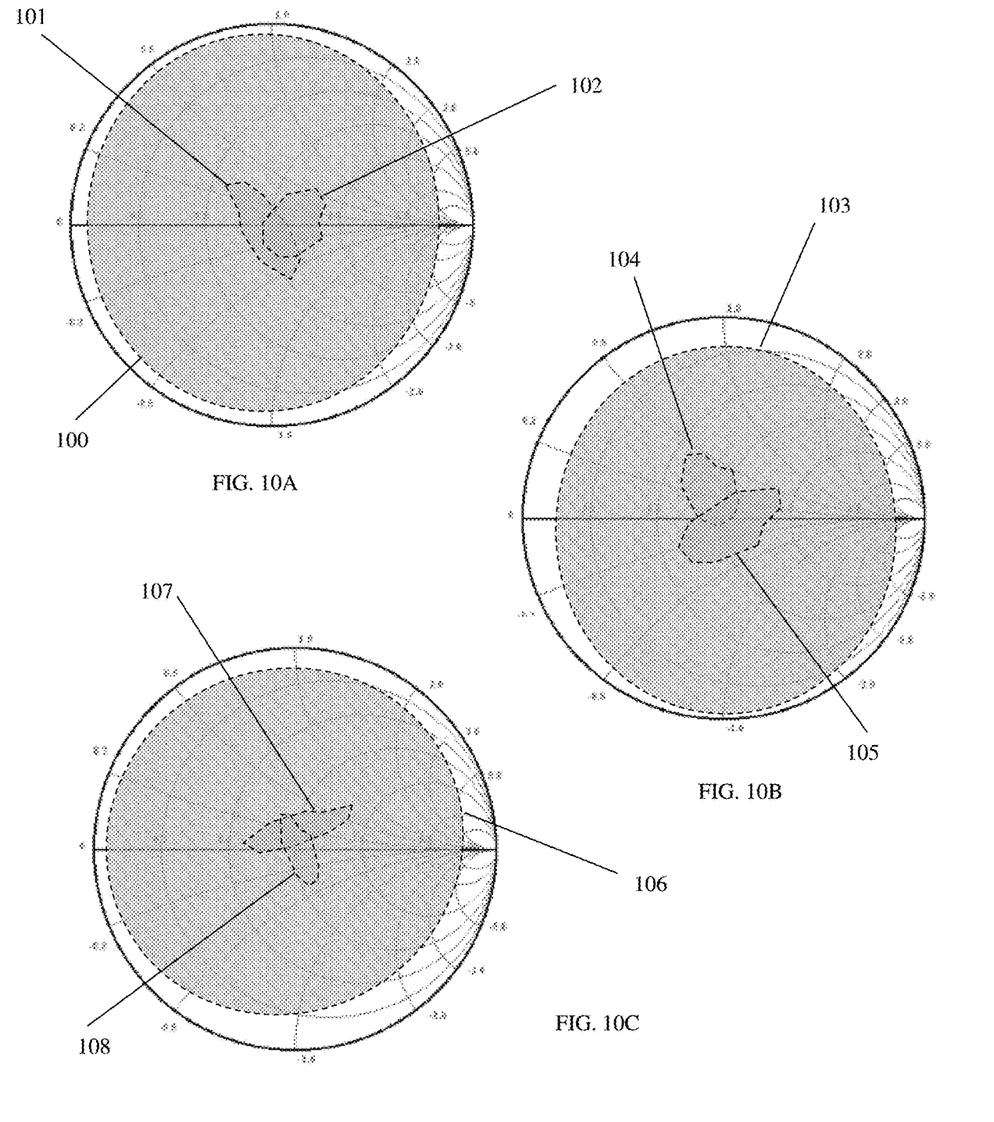

The limited cross-tuning separation of the simple parallel connection of the three tuning modules is enhanced using a filter section (FIG. 5) comprising three series-resonant filter circuits (FIG. 5), which in their simplest configuration comprise an adjustable capacitor in series with a fixed inductor. Filter resonant circuits of this kind respond as shown in FIG. 9. The Fo module responds as shown by trace 90, the 2Fo module as trace 91 and the 3Fo module as trace 92. This additional filtering creates a suppression of the reflection factor response at a non-tuned frequency by a considerable suppression factor, as shown between the Fo and 2Fo response 93. This is shown, schematically in FIG. 10: FIG. 10A shows fundamental frequency (Fo) tuning coverage 100, using the Fo tuning module; 2Fo area 101 and 3Fo area 102 tuning is still present, but it is suppressed in size by the filter resonant set, compared with the surface covered by 2Fo and 3Fo tuning of the tuning modules individually (FIGS. 6A, 6B and 6C). The same phenomenon occurs in FIG. 10B, where the 2Fo tuning module covers most of the Smith chart at 2Fo area 103, whereas undesired tuning at Fo area 104 and 3Fo area 105 are significantly reduced, compared with the tuning areas in FIGS. 7A and 7C. The same principle applies in the case of the 3Fo tuning module, where 3Fo tuning (area 106) covers most of the Smith chart, whereas tuning at Fo (area 107) and 2Fo (area 108) are suppressed, compared with the tuning areas in FIGS. 8A and 8B.

If the resonant filter circuits were static, this harmonic tuner would be very narrowband as shown by traces 90, 91 and 92 in FIG. 9. The tuning modules (FIG. 5) individually cover each up to one octave (Fmax/Fmin≈2). Hereby "cover" means "create sufficient Smith chart reflection factor coverage" such as areas 60, 71 or 82, but not such as areas 61, 62, 70, 72, 80, 81. This tuning capability would be jeopardized by static filter resonant circuits. Therefore the resonant filter circuits comprise adjustable capacitors 50, 51, 52 that allow them to be "tuned in a certain area around their center frequency. Depending on the layout of said filter resonant circuits this frequency area can reach 50% of the center frequency. We therefore can expect total frequency coverage of ±25% to ±35% around Fo.

Harmonic tuning is the capacity of a tuner to synthesize, independently, user defined impedances at two or more harmonic frequencies at the same time, and with each harmonic spectrum component treated, with some level of separation, in a different signal path; the impedance tuner must synthesize a number of different impedances at different frequencies simultaneously; this is a network design task, but with only limited building blocks (in this case variable capacitors). We obviously deal here with a network of multiple resonances; rational equations describing such a network are, in practice, unsolvable; the most efficient and practical way of handling the requirements of synthesizing simultaneously two or more impedances at two or more frequencies is to use an appropriate numeric trial-and-error search algorithm, which samples systematically through the billions of possible tuner settings, as described before, and finds possible tuner configurations for the requested two or more harmonic impedances (tuning). The high number of possible tuner states results from the possible permutations, as follows: Assuming each capacitor has 20 settings; a three capacitor tuning module has $20^3$=8000 settings. Three such modules create a staggering number of $8^3*10^9$=512 billion permutations per frequency.

It has to be mentioned here that the solutions the search algorithm determines are not exact. The way the search algorithm operates, is to search for "nearby" solutions by using an ERROR function. An error function is the sum of differences between the target impedances $Z_T$ and an obtained value $Z_C$ for one, two or three harmonic frequencies. Higher harmonic frequencies can also be included.

The general form of the Error Function used for this optimization task is: EF=$\Sigma\{Z_T(Fi)-Z_C(Fi)\}$, where Fi are various/harmonic frequencies, $Z_T$ are target impedances and $Z_C$ are obtained solutions of the harmonic tuning process. The sum $\Sigma$ is built over (i) which is the number of (harmonic) frequencies and the variables are the motor positions which set the capacitor values, and which are associated with s-parameters (or Z parameters) in the calibration files. When the Error Function EF reaches a minimum value, we have a solution. As in many multi-parameter optimization problems we often get several local minima and the search algorithm has to decide whether to continue searching by changing the starting values of the search, or stop and declare a solution found. Several optimum search algorithms applicable here are known in the literature (see ref. 8). We used, without limiting preference, a gradient and a simplex optimization method alternatively.

In order to be used as an autonomous tuning device the MHz harmonic tuner (FIG. 5) must be calibrated. Calibrated means collecting and saving scattering parameters (s-parameters) of the tuner at a multitude of capacitor settings and all harmonic frequencies of a base frequency Fo selected by the user, i.e. at Fo, 2Fo and 3Fo. For that the tuner is inserted between the test ports of a pre-calibrated vector network analyzer (VNA) and its s-parameters are measured and saved at the three harmonic frequencies Fo, 2Fo and 3Fo and for all tuning states of each tuning module. Typical tuning modules comprise 3 variable capacitors. Each capacitor is set to typically 10 or 20 positions (angles) between complete disengagement (minimum capacitance) and full engagement (maximum capacitance). For 10 capacitor settings this would correspond in $10^3$=1000 states for each tuning module or $10^{3\times3}$=$10^9$ state permutations for the combined three modules. If four capacitors were used (to improve the frequency coverage or maximum reflection factor) and if 20 capacitor settings were used (to improve tuning resolution) then the total number of settings to be measured increases dramatically to $20^3$=8000 (3 capacitors) and 32,000 (four capacitors) i.e. $5.12*10^{11}$ or $3.2*10^{13}$ possible combined states. Calibration sessions would last thousands of hours, weeks or months, or the apparatus is useless. This can be avoided, though: a de-embedding calibration technique is used, by which the initialized tuning module (all capacitors set to minimum value) is measured and its s-parameters are measured and saved in the initialization matrix [S0(F)] at each harmonic frequency F=Fo, 2Fo, 3Fo. Subsequently each capacitor is set to the 10 or 20 values between minimum and maximum capacitance and s-parameters are measured, while all other capacitors remain initialized. Finally the s-parameters of all capacitors, except the first one, are de-embedded, i.e. cascaded with $[S0(F)]^{-1}$ and saved. Finally all s-parameters for all capacitor setting permutations are cascaded in computer memory, a task that takes merely seconds. This de-embedding calibration method reduces calibration time significantly. Instead of measuring $10^3$=1000 (3 capacitors 10 settings each) or $20^4$=160,000 (4 capacitors, 20 settings each) settings, we now measure 3×10=30 or 4×20=80. This procedure applies whether the filter resonant circuits (FIG. 5) are attached, or not. If they are attached the "cross-tuning" effect is simply reduced by a factor, item 93, as shown schematically in FIG. 9. If the filters were not attached, they would have to be measured separately and then cascaded. This, however is impractical and not recommended. The filter capacitors 50, 51, 52 are adjusted to create series resonance at Fo, 2Fo or 3Fo and are fixed during calibration and subsequent tuning. Since the three filter-tuning assemblies are connected in parallel, the s-parameters of each module would have to be converted to Y-parameters and then added. This is done, again, in computer memory and, for convenience, converted back to s-parameters.

Figure 11:
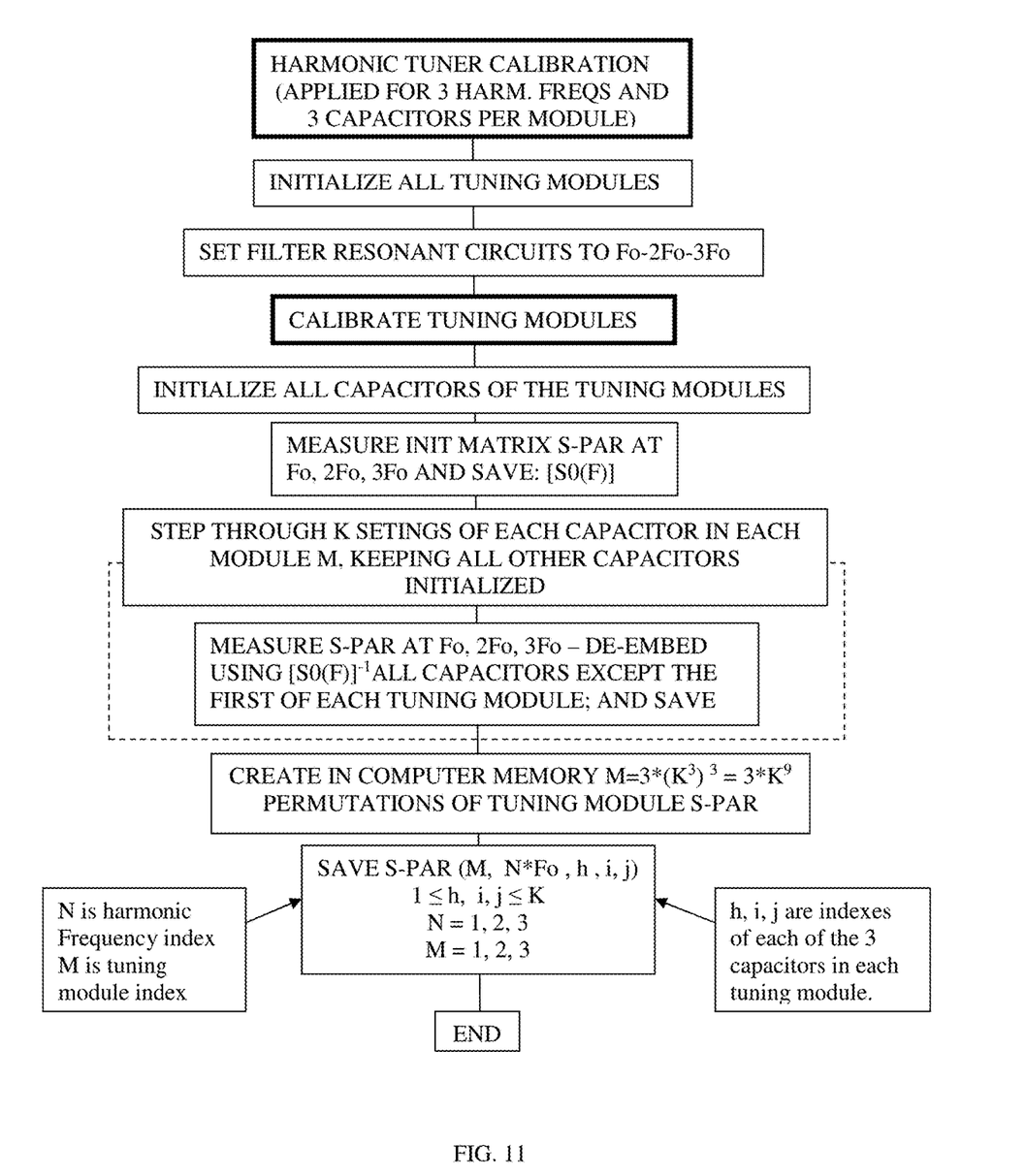
FIG. 11 depicts calibration method flowchart of MHz range harmonic tuner.

In a step by step description the calibration routine executes as follows (see FIG. 11):

a) Each filter resonant circuit is adjusted to its own resonance frequency: the fundamental (Fo) and harmonic frequencies (2Fo and 3Fo);
b) all capacitors in the tuning modules are initialized (disengaged);
c) s-parameters of the overall tuner are measured at Fo, 2Fo and 3Fo between input and output ports and saved in 3 initialization matrices [S0(Fo)], [S0(2Fo)], [S0(3Fo)];
d) measure s-parameters of the tuner at Fo, 2Fo and 3Fo for a multitude "K" (typically 10 to 20) of capacitor settings of the Fo tuning module, de-embed s-parameters of all capacitors, except the one closest to the input port by cascading with $[S0(N*Fo)]^{-1}$ and save;
e) initialize the capacitors of the tuning module in step d) and measure s-parameters of the tuner at Fo, 2Fo and 3Fo for a multitude of capacitor settings of the 2Fo tuning module, de-embed s-parameters of all capacitors except the one closest to the input port by cascading with $[S0(N*Fo)]^{-1}$ and save;
f) initialize the capacitors of the tuning module in step e) and measure s-parameters of the tuner at Fo, 2Fo and 3Fo for a multitude of capacitor settings of the 3Fo tuning module, de-embed s-parameters of all capacitors except the one closest to the input port by cascading with $[S0(N*Fo)]^{-1}$ and save;
g) create, in computer memory, all permutations of s-parameters of steps d) to f) and save in a tuner calibration file.

The end result is a calibration super-matrix [S] comprising s-parameters between the input (test) and output (idle) port of the tuner (FIG. 5) for the combination of tuning capacitor settings (the filter capacitors 50, 51, 52 remain fixed, tuned in each filter to the associated resonance frequency Fo, 2Fo, 3Fo): [S(Fo, CFoi,j, C2Fok,l, C3Fo,m,n)], [S(2Fo, CFoi,j, C2Fok,l, C3Fo,m,n)] and [S(3Fo, CFoi,j, C2Fok,l, C3Fo,m,n)]; whereby CFoi is the "i" capacitor of the Fo tuning module and "j" are its 10 or 20 settings, C2Fok is the "k" capacitor of the 2Fo tuning module and "l" its 10 or 20 settings and so on.

The calibration follows the basic idea that each tuning module affects mostly one harmonic frequency. For that the effect of first capacitor 53 of each tuning module must be included "as is" and the effect of the other two shall be de-embedded, to ensure that the overall structure will not include the initialized structure more than once. What this means is that we have three parallel networks, each acting mostly on one frequency, all other idle components being embedding parasitic contributors. This way the full structure is considered only once and ignored for all other capacitor settings. The super S-matrix is created by cascading s-parameters only inside each tuning module. The overall super matrix is created by adding the Y matrices of the parallel networks associated with Fo, 2Fo and 3Fo, herein named Fo, 2Fo and 3Fo networks.

Figure 12:
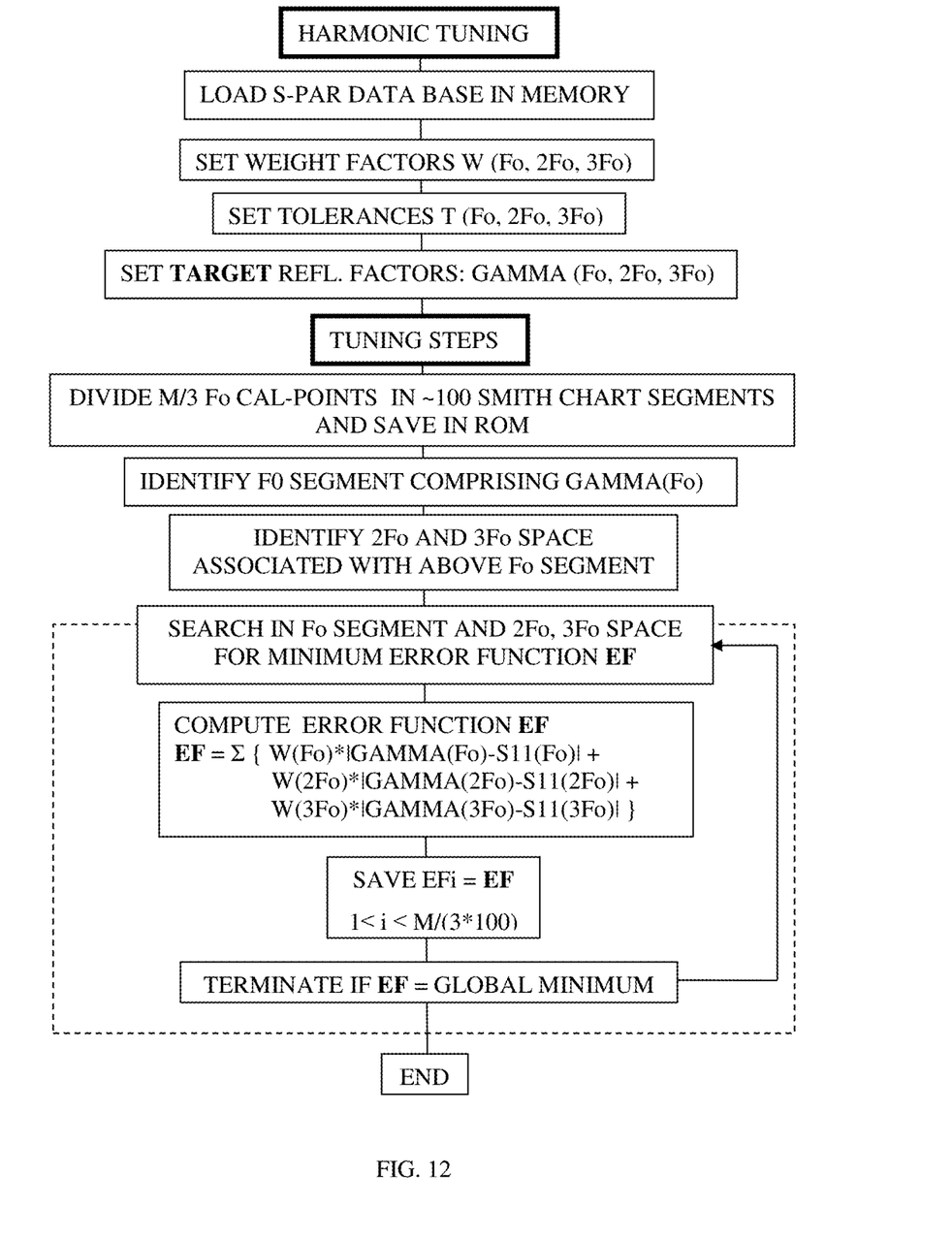
FIG. 12 depicts tuning method flowchart of MHz range harmonic tuner.

The tuning algorithm comprises several steps (see FIG. 12): The user selects tuning tolerances T(Fo), T(2Fo) and T(3Fo), weight factors W(Fo), W(2Fo) and W(3Fo) and target reflection factors Γ(Fo), Γ(2Fo) and Γ(3Fo); the software then loads the tuner calibration file in memory; the Smith chart is divided in approximately 100 or more adjacent segments and a first fast search identifies the segment comprising the tuning target T(Fo); the software then searches through all capacitor Ci settings generating reflection factors at Fo (S11(Fo)) inside the previously identified segment which includes the tuning target T(Fo) and calculates the Error Function (EF(Fo, 2Fo, 3Fo)), as defined below; and saves temporarily the smallest value EFmin and associated capacitor settings, Cio; then, starting with the capacitor settings Cio the search is repeated using interpolated s-parameters, until a global Error Function minimum EF.opt is reached at capacitor settings Ciopt; the capacitor settings are then saved and all capacitors are moved to their optimum settings Ciopt.

The ERROR FUNCTION is calculated using the previously determined s-parameters and comprise the vector difference of S11 (or reflection factors Γ at the tuner test port) from the target values at the three harmonic frequencies. The ERROR FUNCTION is defined as follows:

$$EF=\Sigma\{W(Fo)^*|GAMMA(Fo)-S11(Fo)|+ \\ W(2Fo)^*|GAMMA(2Fo)-S11(2Fo)|+ \\ W(3Fo)^*|GAMMA(3Fo)-S11(3Fo)|\} \quad \{eq.\ 1\}$$

Each frequency is associated with a user-defined weighing (pondering) factor W(N*Fo), N=1,2 or 3, because tuning at Fo has, typically, a larger effect on DUT performance, and must be tuned more accurately, than tuning at 2Fo or 3Fo which can be tuned to with lower tolerance. Note: If the tuner is terminated with Zo=50Ω then GAMMA=S11. In real operation, though, this is not warranted, in which case one has to calculate the real reflection factor generated by the non-50Ω terminated tuner at the test port. Tuning tolerances (T(Fo), T(2Fo), T(3Fo)) are also important and shall be selected for each frequency individually for the same reasons, tighter tolerances are used for Fo, less tight for 2Fo and 3Fo. Tuning tolerances are defined as circles 64 around the peak of the target reflection factor 63 on the Smith chart and have a user defined (small) radius. The smaller the radius, the tighter the tolerance. Effective tuning methods use error functions where their components become zero, if the reflection factor synthesized lies inside the corresponding tolerance circle.

All that has been outlined in the previous paragraphs for the case of a harmonic tuner with twelve motors and twelve associated variable capacitors (which corresponds to three independent tuning-sections with three capacitors each and three filter resonant circuits with one capacitor each) is directly applicable to the case of a two tuning-sections tuner (eight motors and capacitors) or even the more complex four tuning-sections (fifteen motors and capacitors). In this last case, of course, computer memory and speed may be a limitation, since the necessary permutations are huge (the equivalent of $20^9=5.12*10^{11}$, assuming the filter capacitors are fixed). Techniques and search strategies have been developed though, not to use all available data, but to proceed in two steps, i.e. selecting a coarse permutation net first, such as use only 5 or 7 capacitor settings between the minimum and maximum capacitor values (=motor positions), and search first inside this grid, until the impedance search reveals the closest capacitor values, where a solution of the tuning problem exists, and then create permutations in this capacitor value area only, and subsequently proceed with a finer search. Whereas in prior art (see ref. 4) only calibrated points can be used (due to the nature of the electronic PIN diode tuner used), in this invention the tuning resolution is much higher and beyond the calibrated settings also interpolated s-parameter values are used (see ref. 5).

The harmonic load pull tuner is used in a load pull setup, shown in FIG. 2. It comprises, in its simplest configuration, a signal source, a driver amplifier, a DUT fixture, the DUT itself, the harmonic tuner and a power meter. All instruments are remotely controlled and programmable by digital interface. Examples of such digital interfaces are: GPIB, RS232, USB or TCP/IP. The tuner and the instruments are all remotely controlled, set and read from a system control computer, which runs appropriate software; the software processes tuner calibration and interpolation data, calculates tuner positions and circuits the motors and once the impedance conditions are set, it circuits the input signal power required and reads the power meter. The measured results are saved in load pull data files, which can then be plotted using contouring software or can be processed otherwise. Additional instruments, such as a source tuner, a second signal source, a remote power supply and a spectrum analyzer can be added to the setup, for additional testing; although this has been known in the art it shall not impede on the originality of the present invention.

The present embodiment of this invention can easily be adapted to using other types of mechanically adjustable variable capacitors, or electrically adjustable ones, such as Varactor or high frequency Trimmer Capacitor based, which cover higher frequencies, above 200 MHz.

The interpolation routines used in this preferred embodiment, as well as the calibration techniques used are deemed to be the most appropriate for the purpose of harmonic tuning; however different methods can be used for this purpose, but this shall not infer with the innovation and basic idea of the apparatus and its operation described here (see ref. 3).

What is claimed is:

1. A MHz range harmonic impedance tuner comprising
an input port and an output port
and a cascade of a filter section and an impedance tuning section;
wherein
the filter section comprises at least two independent serial resonance circuits of inductor and adjustable capacitor connected in parallel;
and wherein
the tuning section comprises at least two independent tuning modules, each module comprising at least three adjustable shunt capacitors interconnected using transmission lines;
and wherein
the cascades of filter sections and tuning sections are connected in parallel, the common terminal of the filter sections being the input port of the tuner and the common terminal of the tuning sections being the output port of the tuner.

2. The tuner of claim 1,
wherein
the filter section comprises three filter resonant circuits and the tuning section comprises three tuning modules.

3. The tuner of claim 2,
wherein
the series resonance frequencies of the filter resonant circuits are tuned independently to harmonic frequencies Fo (fundamental), 2Fo (first harmonic) and 3Fo (second harmonic).

4. The tuner of claim 3,
wherein
the tuning modules are designed and configured to create maximum tuning range at the frequency range of the associated resonant filter circuit.

5. The tuner of claim 4,
wherein
the capacitors of the filter resonant circuits and of the tuning modules are remotely controlled using stepper motors, electronic control, appropriate gear and control software.

6. A calibration method for tuner as in claim 5 comprising the following steps:
a) adjusting the filter resonant circuits to the fundamental (Fo) and harmonic frequencies (2Fo and 3Fo);
b) initialize (disengage) all capacitors of all tuning modules;
c) measure s-parameters of the tuner at the fundamental Fo and harmonic frequencies 2Fo and 3Fo between input and output ports and save in matrix [S0(N*Fo)], N=1,2,3;
d) measure s-parameters of the tuner at Fo, 2Fo and 3Fo for a multitude of capacitor settings of the Fo tuning module, de-embed s-parameters of all capacitors, except the one closest to the input port by cascading with $[S0(N*Fo)]^{-1}$ and save;
e) initialize the capacitors of the tuning module in step d) and measure s-parameters of the tuner at Fo, 2Fo and 3Fo for a multitude of capacitor settings of the 2Fo tuning module, de-embed s-parameters of all capacitors except the one closest to the input port by cascading with $[S0(N*Fo)]^{-1}$ and save;
f) initialize the capacitors of the tuning module in step e) and measure s-parameters of the tuner at Fo, 2Fo and 3Fo for a multitude of capacitor settings of the 3Fo tuning module, de-embed s-parameters of all capacitors except the one closest to the input port by cascading with $[S0(N*Fo)]^{-1}$ and save;
g) create, in computer memory, all permutations of s-parameters of steps d) to f) and save in tuner calibration file(s).

7. A tuning (impedance synthesis) method for the tuner calibrated as in claim 6 comprising the following steps:
a) select tolerances T(Fo), T(2Fo) and T(3Fo);
b) select weight factors W(Fo), W(2Fo) and W(3Fo);
c) select target reflection factors Γ(Fo), Γ(2Fo) and Γ(3Fo);
d) load the tuner calibration file in memory;
e) divide the reflection factor surface (Smith chart) in approximately 100 or more adjacent segments;
f) identify the segment of step e) comprising the target Γ(Fo);
g) search through all capacitor Ci settings generating reflection factors at Fo (Γ(Fo)) inside the segment of step f), calculate the Error Function (EF(Fo, 2Fo, 3Fo)) and save the smallest value EFmin and associated capacitor settings, Cio;
h) starting with settings Cio repeat step g) using interpolated s-parameters, until a global minimum of EF (EFopt) is reached at capacitor settings Ciopt;
i) save capacitor settings and move all capacitors to their optimum settings Ciopt.

8. The calibration method of claim 6, applied to the tuner of claim 5 for only fundamental (Fo) and one harmonic (2Fo or 3Fo) filter resonant circuits and two associated tuning modules.

9. The tuning method of claim 6, applied to the tuner of claim 5 comprising only two filter resonant circuits and two tuning modules.

* * * * *